US008845816B2

(12) United States Patent
Diaz et al.

(10) Patent No.: US 8,845,816 B2
(45) Date of Patent: Sep. 30, 2014

(54) METHOD EXTENDING THE SERVICE INTERVAL OF A GAS DISTRIBUTION PLATE

(75) Inventors: Adauto Diaz, Saratoga, CA (US); Andrew Nguyen, San Jose, CA (US); Benjamin Schwarz, San Jose, CA (US); Eu Jin Lim, Sunnyvale, CA (US); Jared Ahmad Lee, Santa Clara, CA (US); James P. Cruse, Soquel, CA (US); Li Zhang, Mountain View, CA (US); Scott M. Williams, Sunnyvale, CA (US); Xiaoliang Zhuang, Santa Clara, CA (US); Zhuang Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 148 days.

(21) Appl. No.: 13/408,709

(22) Filed: Feb. 29, 2012

(65) Prior Publication Data

US 2012/0222752 A1 Sep. 6, 2012

Related U.S. Application Data

(60) Provisional application No. 61/448,029, filed on Mar. 1, 2011.

(51) Int. Cl.
*B08B 5/00* (2006.01)
*C23C 16/44* (2006.01)
(52) U.S. Cl.
CPC ............... *B08B 5/00* (2013.01); *C23C 16/4408* (2013.01); *C23C 16/44* (2013.01)
USPC ........................................ 134/22.18; 134/1.3

(58) Field of Classification Search
CPC ................... H01L 21/02008; H21L 21/02019; C23C 16/44; C23C 16/4408; B08B 5/00
USPC ................................................ 134/1.3, 22.18
See application file for complete search history.

(56) References Cited

U.S. PATENT DOCUMENTS

| 4,952,299 A | 8/1990 | Chrisos et al. |
| 5,071,714 A | 12/1991 | Rodbell et al. |
| 5,188,979 A | 2/1993 | Filipiak |

(Continued)

FOREIGN PATENT DOCUMENTS

| JP | 5-326477 A | 12/1993 |
| WO | WO-0151072 A2 | 7/2001 |
| WO | WO-0197257 A2 | 12/2001 |

OTHER PUBLICATIONS

Songlin Xu and Li Diao, "Study of tungsten oxidation in $H_2/H_2/N_2$ downstream plasma", J. Vac. Sci. Technol. A 26(3), May/Jun. 2008.

*Primary Examiner* — Michael Barr
*Assistant Examiner* — Caitlin N Dunlap
(74) *Attorney, Agent, or Firm* — Patterson & Sheridan, LLP

(57) ABSTRACT

Methods for reducing the contamination of a gas distribution plate are provided. In one embodiment, a method for processing a substrate includes transferring the substrate into a chamber, performing a treating process on the substrate, and providing a purge gas into the chamber before or after the treating process to pump out a residue gas relative to the treating process from the chamber. The treating process includes distributing a reactant gas into the chamber through a gas distribution plate.

11 Claims, 4 Drawing Sheets

(56) References Cited

U.S. PATENT DOCUMENTS

| | | | |
|---|---|---|---|
| 5,217,501 | A | 6/1993 | Fuse et al. |
| 5,337,207 | A | 8/1994 | Jones et al. |
| 5,356,833 | A | 10/1994 | Maniar et al. |
| 5,545,289 | A | 8/1996 | Chen et al. |
| 5,571,367 | A | 11/1996 | Nakajima et al. |
| 5,641,702 | A | 6/1997 | Imai et al. |
| 5,840,200 | A | 11/1998 | Nakagawa et al. |
| 6,000,227 | A | 12/1999 | Kroeker |
| 6,136,211 | A | 10/2000 | Qian et al. |
| 6,148,072 | A | 11/2000 | Huang |
| 6,204,141 | B1 | 3/2001 | Lou |
| 6,228,563 | B1 * | 5/2001 | Starov et al. .......... 430/327 |
| 6,228,739 | B1 | 5/2001 | Ha et al. |
| 6,267,074 | B1 | 7/2001 | Okumura |
| 6,270,568 | B1 | 8/2001 | Droopad et al. |
| 6,270,582 | B1 | 8/2001 | Rivkin et al. |
| 6,297,095 | B1 | 10/2001 | Muralidhar et al. |
| 6,300,202 | B1 | 10/2001 | Hobbs et al. |
| 6,300,212 | B1 | 10/2001 | Inoue et al. |
| 6,319,730 | B1 | 11/2001 | Ramdani et al. |
| 6,326,261 | B1 | 12/2001 | Tsang et al. |
| 6,335,207 | B1 | 1/2002 | Joo et al. |
| 6,348,386 | B1 | 2/2002 | Gilmer |
| 6,358,859 | B1 | 3/2002 | Lo et al. |
| 6,414,280 | B1 | 7/2002 | Nishitani et al. |
| 6,440,864 | B1 | 8/2002 | Kropewnicki et al. |
| 6,458,253 | B2 | 10/2002 | Ando et al. |
| 6,479,801 | B1 | 11/2002 | Shigeoka et al. |
| 6,485,988 | B2 | 11/2002 | Ma et al. |
| 6,514,378 | B1 | 2/2003 | Ni et al. |
| 6,528,427 | B2 | 3/2003 | Chebi et al. |
| 6,592,771 | B1 * | 7/2003 | Yamanaka et al. .......... 216/63 |
| 6,635,185 | B2 | 10/2003 | Demmin et al. |
| 6,890,861 | B1 | 5/2005 | Bosch |
| 7,695,232 | B2 | 4/2010 | Moore et al. |
| 7,846,845 | B2 | 12/2010 | Bahng et al. |
| 2001/0055852 | A1 | 12/2001 | Moise et al. |
| 2002/0074312 | A1 | 6/2002 | Ou-Yang et al. |
| 2003/0045131 | A1 * | 3/2003 | Verbeke et al. .......... 438/795 |
| 2003/0170986 | A1 | 9/2003 | Nallan et al. |
| 2004/0002223 | A1 | 1/2004 | Nallan et al. |
| 2004/0007561 | A1 | 1/2004 | Nallan et al. |
| 2004/0043544 | A1 | 3/2004 | Asai et al. |
| 2004/0203251 | A1 | 10/2004 | Kawaguchi et al. |
| 2005/0208714 | A1 | 9/2005 | Yamazaki et al. |
| 2007/0240631 | A1 * | 10/2007 | Nijhawan et al. .......... 117/98 |

\* cited by examiner

METHOD EXTENDING THE SERVICE INTERVAL OF A GAS DISTRIBUTION PLATE

CROSS-REFERENCE TO RELATED APPLICATION

This application claims benefit of U.S. Provisional Application Ser. No. 61/448,029, filed Mar. 1, 2011 which is incorporated by reference in its entirety.

BACKGROUND OF THE INVENTION

1. Field of the Invention

The present invention relates to a method for implementation in a semiconductor processing system, and more particularly, a method for increasing the service interval of a gas distribution plate and the like.

2. Description of the Prior Art

Ultra-large-scale integrated (ULSI) circuits may include more than one million electronic devices (e.g., transistors) that are formed on a semiconductor substrate, such as a silicon substrate, and cooperate to perform various functions within the device. Typically, the transistors used in the ULSI circuits are complementary metal-oxide-semiconductor (CMOS) field effect transistors. A CMOS transistor has a gate structure including a polysilicon gate electrode and gate dielectric, and is disposed between a source region and drain regions that are formed in the substrate. Such formation of integrated circuits involves sequentially forming or depositing multiple electrically conductive and insulative layers in or on the substrate. Etching processes may be used to form geometric patterns in the layers or vias for electrical contact between the layers. General etching processes include wet etching, in which one or more chemical reagents are brought into direct contact with the substrate, and dry etching, such as plasma etching.

Various types of plasma etching processes are known in the art, including plasma etching, reactive ion etching and reactive ion beam etching. In many of these plasma processes, a gas is first introduced into a reaction chamber through a gas distribution plate (GDP) and then plasma is generated from the gas. The ions, free radicals and electrons in the plasma react chemically with the layer material on the semiconductor substrate to form residual products which leave the substrate surface and thus, etch the material from the substrate. The gas distributed by the gas distribution plate not only provides the source for the ions, but can also be used to influence the lateral etch rate.

Before the etching process is performed, the substrate is coated with a layer of resist (for example, a photoresist), the resist is patterned, and the pattern is transferred to underlying layers by etching—with the patterned resist layer serving as an etch mask. Many such etching processes leave resist and post-etch residues on the substrate or substrate that must be removed or stripped before the next processing step. The most common techniques which have been used for photoresist stripping are the use of wet solvent developers such as sulfuric acid-hydrogen peroxide solution, and the technique of plasma ashing.

Further, during plasma etching processes, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate. Abatement processes are used for removing volatile halogen-containing residues left from etching processes.

In the aforementioned processes, the gas distribution plate in the reaction chamber can become gradually contaminated. For instance, volatile reaction products and byproducts coated on the gas distribution plate result in obstruction of the gas flow openings of the gas distribution plate. This causes process drift and poor substrate to substrate repeatability. Additionally, volatile substances and byproducts (e.g., metal oxides) coating the gas distribution plate may promote oxygen recombination during ashing processes. As the level of contamination of the gas distribution plate increases, the ash rate correspondingly suffers degradation. This degradation can be up to 40% and is often the limiting factor for the number of substrates which can be processed between cleaning of the gas distribution plate. Thus, as the mean time between cleans (MTBC) diminishes, productivity suffers.

One method for extending the MTBC is to provide cleaning gas through the gas distribution plate during a specific cleaning operation after one or more substrates have been processed. However, performing cleaning operations consumes time in which substrates cannot be processed and costly aggressive gases which also attach chamber components. Thus, the use of cleaning gas limits productivity and process throughput.

Therefore, a need exists for reducing the contamination of gas distribution plates.

SUMMARY OF THE INVENTION

Methods for reducing the contamination of a gas distribution plate are provided. In one embodiment, a method for processing a substrate includes transferring the substrate into a chamber, performing a treating process on the substrate, and providing a purge gas into the chamber before or after the treating process to pump out a residue gas relative to the treating process from the chamber. The treating process includes distributing a reactant gas into the chamber through a gas distribution plate.

In yet another embodiment, a semiconductor processing system includes a transfer chamber, at least one processing chamber coupled to the transfer chamber, a load lock chamber coupled to the transfer chamber, a gas distribution plate, and a purge gas provider. The load lock chamber is configured to transfer a substrate between an ambient environment outside the semiconductor processing system and a vacuum environment inside the transfer chamber. The gas distribution plate is used for distributing a reactant gas into the load lock chamber in a treating process. The treating process is performed on the substrate in the load lock chamber after the substrate is processed in the processing chamber. The purge gas provider provides a purge gas into the load lock chamber before or after the treating process to pump out a residue gas relative to the treating process from the load lock chamber.

In comparison with the prior art, the present invention prevents the gas distribution plate from becoming contaminated, thus reducing the need to clean. Therefore, the productivity and process throughput can be improved.

The objective of the present invention will no doubt become obvious to those of ordinary skill in the art after reading the following detailed description of the preferred embodiment, which is illustrated in the following figures and drawings.

BRIEF DESCRIPTION OF THE APPENDED DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 3:
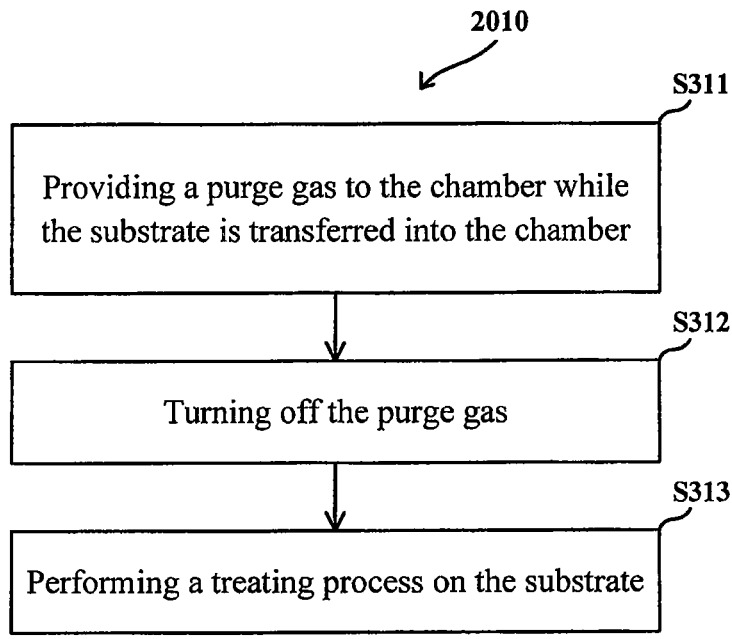
Figure 3:
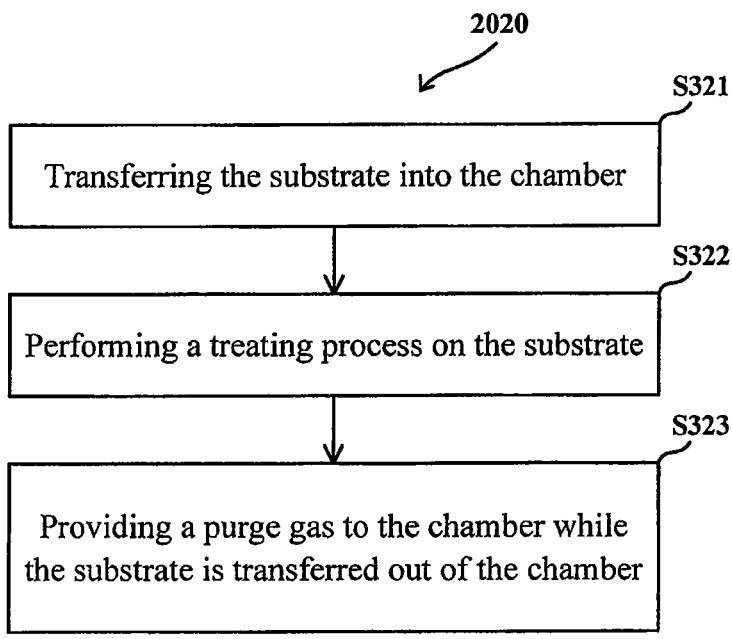
Figure 3:
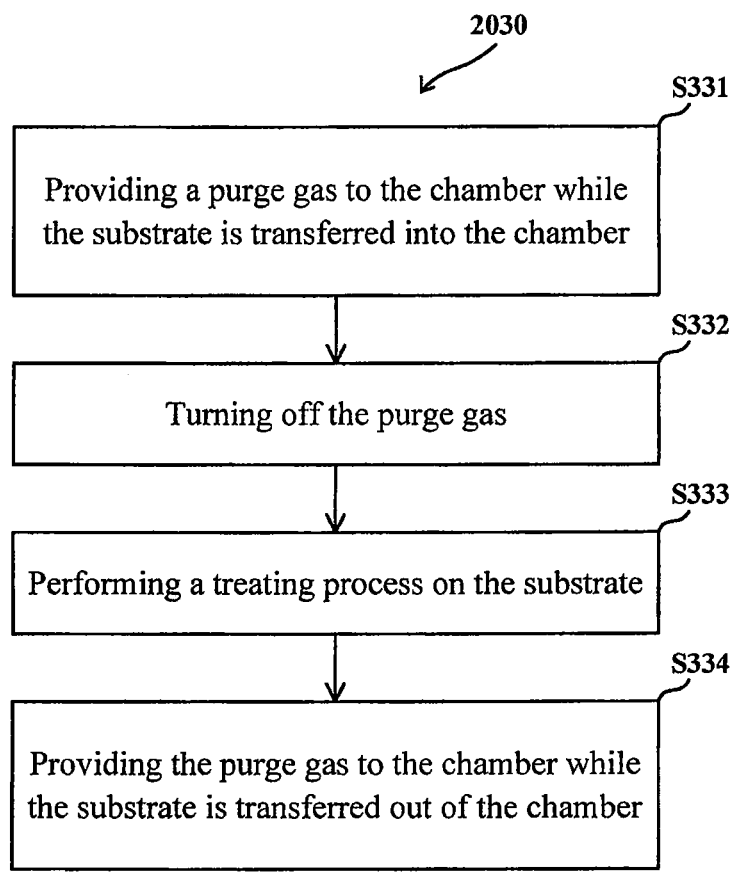

FIG. 3(A)–FIG. 3(C) depict flowcharts of methods for processing a substrate in embodiments according to the present invention.

It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Figure 1:
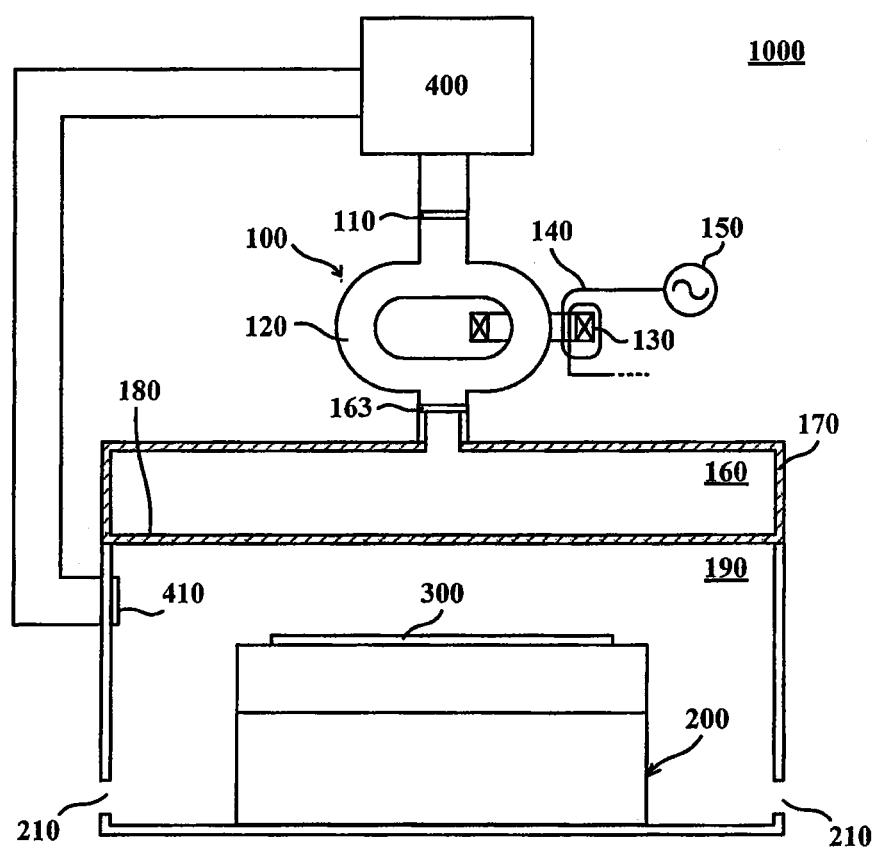
FIG. 1 shows a pictorial representation of an exemplary stripping reactor in which embodiments of the present invention may be practiced.

Embodiments of the present invention provide methods for minimizing contamination of a gas distribution plate. In one embodiment, embodiments of the invention are described in the context of a stripping reactor for removing photoresist from etched substrates. However, the invention may be practiced in other vacuum processing chambers, and wherein a process other than stripping is performed, such as an abatement process, an etch process, a chemical vapor deposition process and the like. FIG. 1 shows a pictorial representation of a stripping reactor 1000 in which embodiments of the invention may be practiced. As shown in FIG. 1, the stripping reactor 1000 includes a remote plasma source 100 (e.g., a microwave or an RF energy-based source). Processing gases, for example, and without limitation, $O_2$, are input through an entrance orifice 110 into a tube 120 from a gas panel 400.

The tube 120 is surrounded by a ferrite core 130, and wires 140 surround at least a portion of the ferrite core 130. RF energy supplied by an RF power supply 150 is inductively coupled to processing gases flowing into and through the tube 120 to generate plasma therein. Plasma species generated in the tube 120 flow through the exit tube 163 as a reactant gas, and enter the gas distribution plenum 160. As shown in FIG. 1, the exit tube 163 and gas distribution plenum 160 include liners 170 for reducing recombination of the plasma species generated by the remote plasma source 100. The Gas distribution plate 180 forms a bottom portion of the gas distribution plenum 160. In one embodiment, the gas distribution plate 180 is a perforated plate or a showerhead, and as such, advantageously provides good flow uniformity of gas into the stripping chamber 190. A plasma can also be generated in the stripping chamber 190 to enhance stripping rates over those obtained by use of the remote plasma source 100 alone, for example, by providing RF power to the gas distribution plate 180.

As further shown in FIG. 1, the stripping reactor 1000 includes a substrate support pedestal 200. A substrate 300 is transferred into and out of the stripping chamber 190 by a robot arm from a transfer chamber (not shown). The substrate support pedestal 200 may be moved, for example, in a vertical direction, to change a distance between the substrate 300 disposed on the substrate support pedestal 200 and the gas distribution plate 180. During the stripping process, ions from the reactant gas bombard the surface on the substrate 300 and photoresist thereon is accordingly removed. A pumping system (not shown) is used for maintaining the stripping chamber 190 a vacuum during the stripping process by pumping gases out through pump exhausts 210. In one embodiment, pressure in the stripping chamber 190 may be maintained in a rage from about 0.1 to about 10 Torr.

As mentioned above, the gas distribution plate 180 in the stripping chamber 190 may be gradually contaminated by volatile reaction products and byproducts generated in stripping processes. In one embodiment, before the substrate 300 is transferred into the stripping chamber 190, the gas panel 400 provides a purge gas into the stripping chamber 190 through the gas distribution plate 180 while the stripping chamber 190 is empty prior to receiving the substrate 300. Alternatively, or in addition to, the gas panel 400 may provide purge gas into the stripping chamber 190 through ports 410 positioned below the gas distribution plate 180. By pouring a purge gas prior to transferring the substrate into the stripping chamber 190, residue gases generated in the previous stripping process and still present in the stripping chamber 190 are prevented from contacting the gas distribution plate 180 and pumped out of the stripping chamber 190 via the pump exhausts 210. Further, the gas panel 400 may also provide the purge gas while the substrate 300 is being transferred into the stripping chamber 190.

By preventing residual gases from contacting the gas distribution plate 180, byproduct coating corrosive attack or other contamination of the gas distribution plate 180 is greatly reduced. In one embodiment, the purge gas includes, for example, but not limited to, a nitrogen ($N_2$) gas, an inert gas (e.g. argon (Ar) or helium (He)), or combinations of these gases.

The purge gas can be provided into the stripping chamber 190 before the substrate enters up until the stripping process is ready to be performed, for example, until process gases are provided through the remote plasma source 100 and delivered into the stripping chamber 190. The purge gas delivery is turned off while the substrate 300 is processed in the stripping chamber 190. In one embodiment, the purge gas can also be provided into the stripping chamber 190 once the flow of processing gases stop and while the substrate 300 is being transferred out of the stripping chamber 190 after the stripping process. Providing the purge gas after the stripping process not only protects the gas distribution plate 180, but also assists the removal of residue gases generated in the stripping process from the stripping chamber 190. Similarly, the purge gas can be continuously provided until the next substrate is loaded into the stripping chamber 190 and the next stripping process is ready to be performed.

The purge gas is provide at a rate sufficient to allow volatile gases offgassed from the substrate 300 or residual gasses from the stripping process to be pumped out and removed from the stripping chamber 190 while providing a protective purge gas barrier around the gas distribution plate 180. In one embodiment, the gas panel 400 provides the purge gas at a flow rate of at least about 5000 sccm through the gas distribution plate 180.

Figure 2:
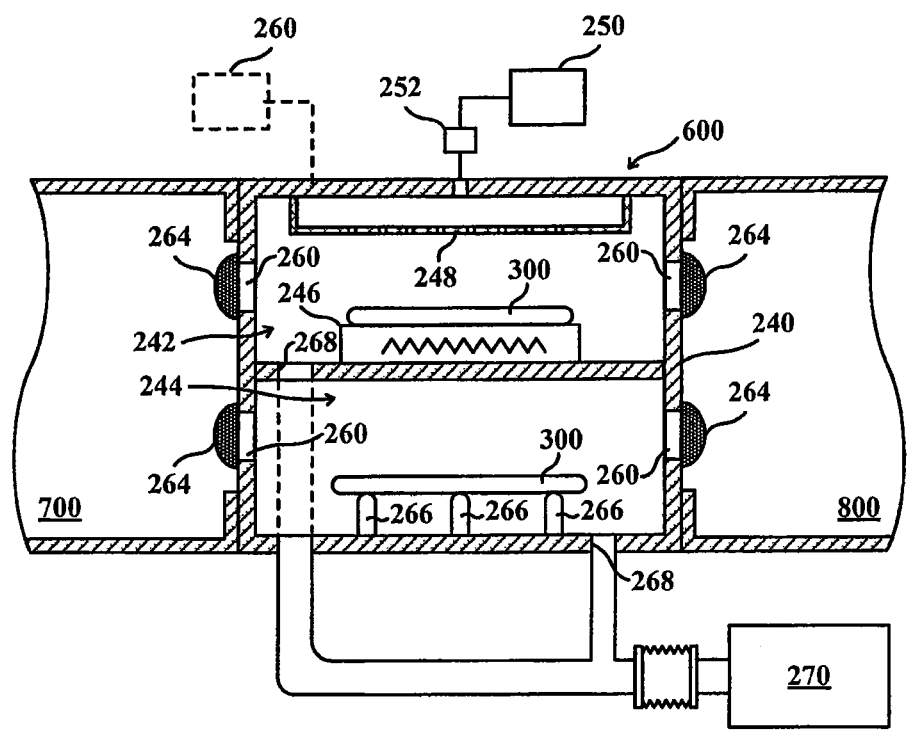
FIG. 2 shows a pictorial representation of an exemplary load lock chamber in which embodiments of the present invention may be practiced.

In another embodiment according to the present invention, the method may be practiced in a load lock chamber for removing volatile residues from a substrate. FIG. 2 shows a pictorial representation of an exemplary load lock chamber 600. A factory interface 700 is coupled to a transfer chamber 800 by the load lock chamber 600. The transfer chamber 800 is further coupled between a plurality of processing chambers (not shown). The factory interface 700 is configured to transfer substrates to the processing chambers for processing through the load lock chamber 600 and the transfer chamber 800. The load lock chamber 600 has a chamber body 240 having a first chamber 242 and a second chamber 244 defined therein. The first chamber 242 is isolated from the second chamber 244 such that the pressure within the chambers 242, 244 may be independently controlled. The first chamber 242, shown in the embodiment depicted in FIG. 2 stacked above the second chamber 244, is configured to not only transfer substrates between the factory interface 700 and transfer chamber 800, but also to process a substrate 300 is disposed therein. In one embodiment, the first chamber 242 is configured to perform at least one of an ashing or abatement process.

In the embodiment depicted in FIG. 1, the first chamber 242 includes a heated substrate support pedestal 246 disposed below a gas distribution plate 248. A gas panel 250 is coupled to the first chamber 242 through a remote plasma source 252 such that reactive specifies from a processing gas may be provided into the first chamber 242 through the gas distribution plate 248 to process the substrate 300 disposed on the heated substrate support pedestal 246. The gas panel 250 is also configured to provide a purged gas as discussed above. The first chamber 242 may be utilized to pass substrates from the transfer chamber 800 to the factory interface 700, while the second chamber 244 may be solely utilized to have unprocessed substrates from the factory interface 700 into the transfer chamber 800, thereby minimizing the potential of cross contamination between processed and unprocessed substrates.

In one embodiment, at least one of the process chambers coupled to the transfer chamber 800 is an etch chamber. The etch chambers may use a halogen-containing gas to etch the substrates therein. Examples of halogen-containing gas include hydrogen bromide (HBr), chlorine ($Cl_2$), carbon tetrafluoride ($CF_4$), and the like. After etching the substrate, halogen-containing residues may be left on the substrate surface and may be removed by a thermal abatement process in the first chamber 242 of the load lock chamber 600.

During halogen-containing residue removal process, the substrate support pedestal 246 may raise the temperature of the processed substrate, thereby converting the halogen-containing residues to non-volatile compounds that may be pumped out of the first chamber 242 of the load lock chamber 600. During the removal process, one or more process gases may be supplied into the first chamber 242 of the load lock chamber 600 to promote halogen removal. The remote plasma source 252 is utilized to assist in removing the halogen-containing residues from the substrate surfaces by providing reactive species which bind or react with the non-volatile compounds and/or halogen containing residues.

In one embodiment, reactive species are supplied to the first chamber 242 of the load lock chamber 600 through the gas distribution plate 248. As mentioned above, the gas distribution plate 248 in the load lock chamber 600 may be gradually contaminated by volatile reaction products and byproducts generated in the abatement process.

In one embodiment, before the substrate 300 is transferred into the first chamber 242 of the load lock chamber 600, the gas panel 250 provides a purge gas into the first chamber 242 through the gas distribution plate 248. Residue gases generated during the previous abatement process remaining in the load lock chamber 600 may be pumped out with the purge gas. The purge gas also protects the gas distribution plate 248 by providing a purge gas barrier which prevents residual gases from reaching and contaminating the gas distribution plate 248. Further, the gas panel 250 can also provide the purge gas while the substrate 300 is transferred into the first chamber 242 from the transfer chamber 800, and optionally be continually provided until the next substrate is loaded into the first chamber 242 from the transfer chamber 800. In one embodiment, the purge gas includes, for example, but not limited to, a nitrogen ($N_2$) gas, an inert gas (e.g. argon (Ar) or helium (He)), or combinations of these gases.

The purge gas can be provided into the first chamber 242 before and until the removal process is ready to be performed, for example, until the plasma has been generated. The purge gas may be turned off while the substrate 300 is processed in the first chamber 242. In one embodiment, the purge gas can be provided into the first chamber 242 while the substrates 300 is transferred out from the load lock chamber 600 after the abatement process. Providing the purge gas after the abatement process can remove any residue gases still present in the first chamber 242 after the abatement process performed on the substrate is complete. Similarly, the purge gas can be continuously provided until the next removal process is ready to be performed.

The purge gas is provide at a rate sufficient to allow gases offgassed from the substrate 300 or residual gases left over from the abatement process to be pumped out and removed from the load lock chamber 600 while protecting the gas distribution plate 248 from contamination. In one embodiment, the gas panel 250 provides the purge gas at a flow rate about 5000 sccm. Furthermore, as shown in FIG. 2, the gas panel 250 provides the purge gas through the gas distribution plate 248. Therefore, contamination of the gas distribution plate 180 is reduced, resulting in diminished process drift and extended mean times between cleans.

Although the first chamber 242 of the load lock chamber 600 has been described as configured to perform an abatement process, it is contemplated that the method of providing purged gas through gas distribution plate during non-processing periods may be applied equally effectively to gas distribution plates utilized for stripping processes, etch processes, CVD processes and the like.

FIG. 3(A)~FIG. 3(C) depict flowcharts of methods for processing a substrate in embodiments according to the present invention. The methods 2010~2030 can be configured to perform at the stripping reactor 1000 as described in FIG. 1, the load lock chamber 600 as described in FIG. 2 or other vacuum chamber having a gas distribution plate. It is contemplated that the methods 2010~2030 may be performed in other suitable semiconductor processing systems, including those from other manufacturers.

As shown in FIG. 3(A), the method 2010 begins at step S311 by providing a purge gas into the chamber while a substrate is transferred into the chamber from the transfer chamber. In one embodiment, the substrate has at least one of photoresist or halogen-containing residue disposed thereon. At block S312, the purge gas is turned off and a process gas is provided from the gas panel into the chamber through the gas distribution plate. At block S313, a treating process is performed on the substrate using the process gas. The treating process includes distributing the process gas into the chamber through the gas distribution plate. Because the purging gas is provided during the substrate transfer, the undesired gases escaping from the surface of the substrate is prevented from contaminating the gas distribution plate. Thus, the service life of the gas distribution plate can be extended while advantageously reducing process draft.

FIG. 3(B) depicts the flowchart of a method for processing a substrate in another embodiment according to the present invention. The method 2020 begins at block S321 by transferring the substrate into the chamber. At block S322, a treating process is performed on the substrate. The treating process includes distributing a processing gas into the chamber through a gas distribution plate. At block S323, a purge gas is provided into the chamber when the flow of processing gas is terminated. The purge gas is provided to the chamber while the substrate is transferred out of the chamber. Similarly, because the purging process is performed during the substrate transfer, the undesired gases can be removed and a gas distribution plate protected.

FIG. 3(C) depicts the flowchart of a method for processing a substrate in yet another embodiment according to the present invention. The method 2030 begins at block S331 by providing a purge gas into the chamber while the substrate is transferred into the chamber. At block S332, the purge gas is turned off and processing gas is provided to the chamber. At block S333, a treating process is performed on the substrate. The treating process includes distribution a processing gas into the chamber through a gas distribution plate. The treating process may be at least one of an abatement process, a photoresist stripping process, an etch process, a chemical vapor deposition process and the like. At block S334, the purge gas is provided again to the chamber once the flow of processing gas is terminated. The purge gas is provided to the chamber while the substrate is transferred out of the chamber. In this embodiment, the purging process is performed during both the substrate transfer-in and transfer-out periods. The treating process may be one of the processes described above.

It is contemplated that in any of the methods described above with reference to FIGS. 3A-C, the purge gas may be provided while the chamber is empty and idol prior to receiving a new substrate for processing. It is also contemplated that in any of the methods described above, the purge gas may be provided in addition to the process gas during the treating process.

As described above, the present invention provides methods and systems for preventing a gas distribution plate from being contaminated. In comparison with the prior art, the present invention prevents the gas distribution plate from becoming contaminated, thus reducing the need to clean. Further, because the purging process is performed during the substrate transfer durations and the duration of waiting for the treating processes to be ready, the overall process cycle time is not increased.

While the foregoing is directed to embodiments of the present invention, other and further embodiments of the invention may be devised without departing from the basic scope thereof, and the scope thereof is determined by the claims that follow.

What is claimed is:

1. A method for processing a substrate, comprising:
    performing an etch process on a substrate in a first chamber wherein the etch process comprises exposing one or more layers of a film stack to etchants comprising at least one halogen-containing gas;
    after performing the etch process, transferring the substrate into a second chamber;
    performing a treating process on the substrate in the second chamber, wherein the treating process comprises distributing a processing gas into the second chamber through a gas distribution plate and removing halogen-containing etch residues from the substrate;
    transferring the substrate out of the second chamber; and
    providing a purge gas into the second chamber during at least one of transferring the substrate into or out of the second chamber, wherein providing the purge gas comprises providing the purge gas through the gas distribution plate.

2. The method of claim 1, wherein providing the purge gas comprises:
    providing nitrogen gas or an inert gas into the second chamber.

3. The method of claim 1, comprising:
    providing purge gas into the second chamber before the substrate is transferred into the second chamber.

4. The method of claim 1, wherein the purge gas is provided into the second chamber from a time that process gas flow is terminated until process gas flow resumes.

5. The method of claim 1, wherein the purge gas is provided into the second chamber below the substrate support.

6. The method of claim 1, wherein the purge gas is provided at a flow rate of at least about 5000 sccm.

7. The method of claim 1, wherein the treating process comprises:
    removing photoresist from the substrate.

8. The method of claim 1, wherein transferring the substrate out of the second chamber further comprises:
    transferring the substrate to a factory interface.

9. A method for processing a substrate comprising:
    performing an etch process on a substrate in an etch chamber wherein the etch process comprises exposing one or more layers of a film stack to etchants comprising at least one halogen-containing gas;
    transferring the substrate into a first chamber of a chamber body, the chamber body having a second chamber;
    performing a treating process on the substrate in the first chamber, wherein the treating process comprises distributing a processing gas into the first chamber through a gas distribution plate and removing halogen-containing etch residues from the substrate;
    transferring the substrate out of the first chamber;
    providing a purge gas into the first chamber during at least one of the transferring of the substrate into or out of the first chamber, wherein providing the purge gas comprises providing the purge gas through the gas distribution plate; and
    transferring the substrate into the second chamber.

10. The method of claim 9, wherein providing the purge gas comprises providing the purge gas through the gas distribution plate and through a port positioned below the gas distribution plate.

11. The method of claim 9, wherein the purge gas is provided at a flow rate of at least about 5000 sccm.

* * * * *